United States Patent

Liu et al.

Patent Number: 6,037,258
Date of Patent: Mar. 14, 2000

[54] METHOD OF FORMING A SMOOTH COPPER SEED LAYER FOR A COPPER DAMASCENE STRUCTURE

[75] Inventors: Chung-Shi Liu; Chen-Hua Yu, both of Hsin-Chu, Taiwan

[73] Assignee: Taiwan Semiconductor Manufacturing Company, Hsin-Chu, Taiwan

[21] Appl. No.: 09/307,206

[22] Filed: May 7, 1999

[51] Int. Cl.[7] .................................................. H01L 21/28
[52] U.S. Cl. .......................... 438/687; 438/760; 438/765; 438/776; 438/774
[58] Field of Search .................................. 438/758, 760, 438/765, 776, 774, 687

[56] References Cited

U.S. PATENT DOCUMENTS

| | | | |
|---|---|---|---|
| 4,657,778 | 4/1987 | Moran | 427/53.1 |
| 4,842,891 | 6/1989 | Miyazaki et al. | 427/35 |
| 5,312,509 | 5/1994 | Eschbach | 156/345 |
| 5,674,787 | 10/1997 | Zhao et al. | 437/230 |
| 5,933,758 | 8/1999 | Jain | 438/687 |

OTHER PUBLICATIONS

Wolf, "Silicon Processing for the VLSI Era vol. 2–Process Integration", pp. 220–222, 1990.

*Primary Examiner*—Chandra Chaudhari
*Assistant Examiner*—Lisa Kilday
*Attorney, Agent, or Firm*—George O. Saile; Stephen B. Ackerman

[57] ABSTRACT

A method for fabricating a copper interconnect structure, in a damascene type opening, comprised a thick copper layer, obtained via an electro-chemical deposition procedure, and comprised of an underlying, copper seed layer, featuring a smooth top surface topography, has been developed. The smooth top surface topography, of the underlying copper seed layer, is needed to allow the voidless deposition of the overlying, thick copper layer, and is also needed to allow the deposition of the overlying thick copper layer to be realized, with a surface that can survive a chemical mechanical polishing procedure, without the risk of unwanted dishing or spooning phenomena. The desirable, copper seed layer, is obtained via a process sequence that features: a plasma vapor deposition of a first copper seed layer; an argon purge procedure; and a second plasma vapor deposition of a second copper seed layer. The use of an argon purge, allows the increase in temperature, introduced by plasma bombardment, to be decreased, allowing a copper seed layer, featuring a smooth top surface topography, to be obtained.

14 Claims, 2 Drawing Sheets

METHOD OF FORMING A SMOOTH COPPER SEED LAYER FOR A COPPER DAMASCENE STRUCTURE

BACKGROUND OF THE INVENTION (1) Field of the Invention

The present invention relates to a method used to fabricate copper metal interconnect, and copper metal via structures, for semiconductor devices.

(2) Description of Prior Art

The semiconductor industry is continually attempting to increase device performance while still attempting to lower the manufacturing cost for these same semiconductor devices. The ability to create semiconductor devices with sub-micron features, or micro-miniaturization, has allowed the performance and cost objectives to be successfully addressed. For example smaller features result in decreases in performance degrading capacitances and resistances, for device regions in the semiconductor substrate. In addition the use of sub-micron features, allows smaller semiconductor chips to be realized, however still possessing device densities comparable to densities achieved with larger semiconductor chip counterparts. This allows more chips to be realized from a specific size starting substrate, thus reducing the processing cost for a specific semiconductor chip.

In addition to the performance and cost benefits attributed to micro-miniaturization, the semiconductor industry is still attempting to improve device performance by utilizing copper wiring, in place of the lower conductivity, aluminum wiring, now being used for advanced semiconductor devices. The low resistivity, about 1.7E-6 ohm-cm, of copper, would allow the use of thinner, and narrower structures, such as a dual damascene copper structure, featuring narrower via structures, and thinner overlying interconnect structures, however still providing the same desired current carrying capabilities, as thicker, and wider, aluminum interconnect and via structure counterparts. In addition, for a specific current density, copper would provide a greater degree of electromigration resistance, than aluminum based counterparts.

The use of copper interconnect structures, however, introduces several new concerns, not relevant with the aluminum based metallization. For example the thickest copper layer, used to fill a dual damascene opening, can not be realized using conventional plasma deposition procedures, and thus has to be obtained using a electro-chemical deposition, (ECD), procedure. However to effectively use the ECD procedure, an underlying copper seed layer has to be present, to initiate the deposition of the thick copper layer. The thinner copper seed layer, is obtained via plasma vapor deposition, (PVD), however this layer can present undesirable blistering, or other imperfections, as a result of an unwanted increase in deposition temperature, resulting from plasma bombardment, during the PVD procedure. The rough surface presented by the copper seed layer, is transferred to the depositing, overlying, ECD copper layer, in the form of voids. A subsequent chemical mechanical polishing, (CMP), procedure, used to define the dual damascene, copper structure, can then expose the voids in the ECD copper layer, resulting in yield or reliability failures.

This invention will provide a solution to the voids in the ECD copper layer, via a process sequence which allows a copper seed layer, with a smooth top surface topography, to be plasma deposited, and to subsequently allow the overlying ECD copper layer, to be deposited, with an absence of voids. The copper seed layer, featuring a smooth top surface topography, is obtained via a three step deposition sequence. A first step comprises deposition of a first portion of the copper seed layer, via a PVD procedure, while the second step, featuring a cool down cycle, is performed in the same, or in a different chamber, of PVD cluster tool. The third step of the sequence features the deposition of an overlying, or second portion of the copper seed layer, performed in the same chamber used for the cool down cycle, or performed in a different chamber of the cluster PVD tool. The cool down cycle, accomplished via exposing both sides of the wafer to an inert purge, does not allow the surface temperature to increase to a point, during the growth of the copper seed layer, that would result in the undesirable, rough surface topography. Prior art, such as Moran, in U.S. Pat. No. 4,657,778, describes the use of an underlying copper seed layer, prior to depositing a thick copper layer, using an ECD procedure. However that prior art does not use the three step, copper seed layer, PVD procedure, used to present a smooth top surface topography, for am overlying ECD copper layer.

SUMMARY OF THE INVENTION

It is an object of this invention to create copper damascene, or dual damascene, via, and interconnect structures.

It is another object of this invention to deposit an underlying copper seed layer, featuring a smooth top surface topography, prior to the copper filling of a damascene, or dual damascene opening, via an electro-chemical deposition procedure.

It is still another object of this invention to use a three step deposition sequence to obtain a copper seed layer, comprised with a smooth top surface topography, with the three step deposition sequence featuring an in situ, cool down cycle, performed after deposition of a lower portion of a plasma deposited, copper seed layer, and prior to the in situ, plasma deposition of an upper portion of copper seed layer.

In accordance with the present invention, a method is described for forming copper structures, in damascene, or dual damascene openings, using electro-chemical deposition of a thick copper, on an underlying, copper seed layer, and featuring a copper seed layer, with a smooth top surface topography, obtained using a three step, plasma vapor deposition procedure. An opening in an insulator layer, damascene, or dual damascene, is provided, exposing a conductive region at the bottom of the opening. A barrier layer of tantalum, or tantalum nitride, is deposited in a first chamber of cluster tool, coating the walls of the damascene opening, and overlying and contacting the conductive region, exposed at the bottom of the opening. A first portion of a copper seed layer, is plasma vapor deposited on the barrier layer, in a second chamber of the cluster tool. A first iteration of this invention features an in situ cool down cycle, performed in the second chamber of the cluster tool, via use of an argon purge, performed to both sides of the wafer, followed by the plasma vapor deposition of a second portion of the copper seed layer, performed in situ, in the second chamber of the cluster tool.

A second iteration of this invention is to perform the cool down cycle, in a third chamber of the cluster tool, using cooling water for thermal transfer. The second portion of the copper seed layer, is then plasma vapor deposited on the cooled, first portion of copper seed layer, in either the second chamber, or in a fourth chamber, of the cluster tool. For both iterations, a cooper seed layer, with a smooth top surface topography, is realized. An electro-chemical deposition of a thick copper layer, fills the damascene, or dual damascene opening, followed by a CMP procedure, resulting in a copper structure, in the damascene, or dual damascene opening.

BRIEF DESCRIPTION OF THE INVENTION

The object and other advantages of this invention are best described in the preferred embodiment with reference to the drawings that include:

FIGS. 1–5, which schematically, in cross-sectional style, show the stages of formation of a damascene, or dual damascene copper structure, featuring the use of an underlying copper seed layer, and an overlying thick, electochemical deposited, copper layer, featuring a cooper seed layer, comprised with a smooth top surface topography, obtained using a three step deposition procedure.

DESCRIPTION OF THE PREFERRED EMBODIMENTS

The method of fabricating a copper structure, comprised of an underlying copper seed layer, featuring a smooth top surface topography, resulting from the use of a three step, plasma vapor deposition procedure, and comprised an overlying, thick, copper layer, obtained via an electrochemical deposition procedure, will now be described in detail. The copper structure described in this invention is formed in a dual damascene opening, resulting in a wide, copper interconnect structure, overlying a narrower, copper via structure, however this invention can be used to create either copper via structures, or copper interconnect structures, in a single damascene opening.

Figure 1:
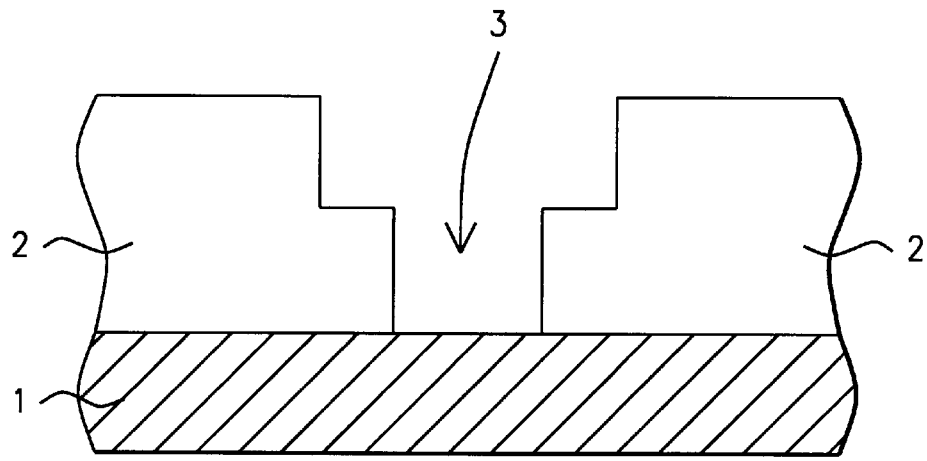

A conductive region 1, comprised of an underlying interconnect structure, is schematically shown in FIG. 1. The underlying interconnect structure can be comprised from a group of materials including, an aluminum based layer, a refractory metal such as tungsten, or a metal silicide layer such as tungsten silicide. An insulator 2, comprised of either silicon oxide, or a doped silicon oxide layer, such as a boro-phosphosilicate layer, is formed on underlying conductive region 1. Dual damascene opening 3, is created in insulator layer 2, exposing a portion of the top surface of conductive region 1. Conventional photolithographic and anisotropic, reactive ion etching, (RIE), procedures, using $CHF_3$ as an etchant, are initially used to create the wide diameter opening of dual damascene opening 3, followed by a second photolithographic and RIE procedure, again using $CHF_3$ as an etchant, creating the narrow diameter opening, of dual damascene opening 3. This is schematically shown in FIG. 1.

After removal of the photoresist shapes, used to define dual damascene opening 3, via plasma oxygen ashing and careful wet cleans, a series of deposition are performed in a cluster tool that is comprised with specific chambers, allowing a barrier layer deposition, and a multi-step, copper seed layer deposition, to be performed in situ. The semiconductor substrate, featuring dual damascene opening 3, exposing conductive region 1, is first moved to a first chamber of the cluster tool, for deposition of a barrier layer 4, of tantalum, or tantalum nitride. A plasma vapor deposition, (PVD), procedure, such as R.F. sputtering, is used for deposition of barrier layer 4, at a temperature between about 20 to 300° C., to a thickness between about 100 to 600 Angstroms. Barrier layer 4, of tantalum, or tantalum nitride, is shown schematically in FIG. 2, coating the sides of dual damascene opening 3, as well as overlying the conductive region 1, exposed at the bottom of dual damascene opening 3, and will serve as a barrier layer, for a subsequent, overlying copper layer, preventing copper from reaching underlying regions, such as insulator layer 2, or conductive region 1.

To enable adequate copper filling of dual damascene opening 3, a electro-chemical deposition, (ECD), procedure is used, allowing the needed thick copper deposition to be realized. However to initiate the ECD procedure, an underlying copper seed layer is first needed. The copper seed layer has to be between about 800 to 2500 Angstroms, in thickness, to allow a successful ECD copper deposition to occur. The copper seed layer is obtained via PVD procedures, such as R.F. sputtering. However during the PVD procedure a temperature increase occurs as a result of plasma bombardment, resulting in a copper seed layer presenting a rough, top surface topography. A subsequent ECD copper layer, formed overlying the rough surface of the copper seed layer, will itself now form with a rough surface, in addition to forming with included in the ECD copper layer. Further processing, such as the removal of unwanted regions of copper, via a chemical mechanical polishing, (CMP), process, can expose the voids in the ECD copper layer resulting in possible yield or reliability problems. In addition the rough top surface topography, of the ECD copper layer, can present difficulties for the CMP procedure, such as unwanted removal, or dishing of the copper layer, located in the dual damascene opening. Therefore a multi-step, copper seed deposition procedure, is used, featuring a cool down cycle, allowing the desired thickness of the copper seed layer to be obtained, however without the rough top surface topography, encountered without the use of a cool down cycle.

Figure 2:
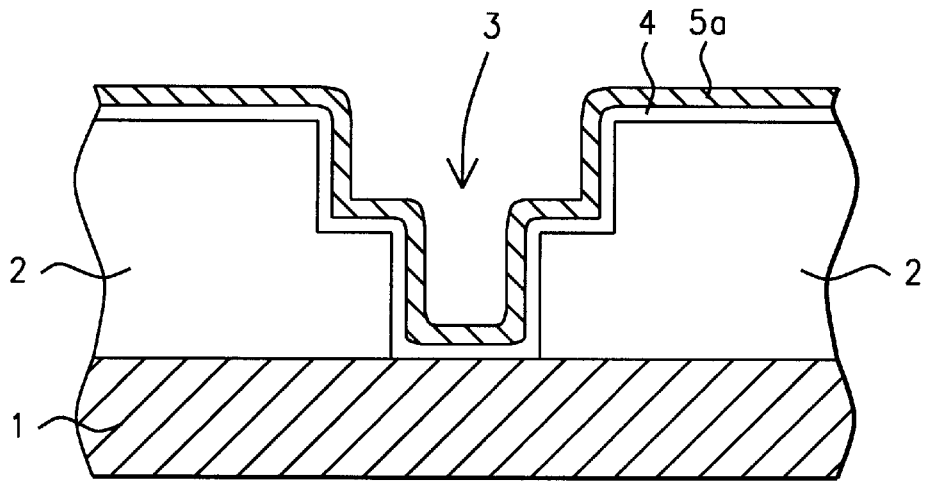

A first step, of the copper seed layer deposition sequence, is the deposition of copper seed layer 5a, shown schematically in FIG. 2. Copper seed layer 5a, is deposited using a PVD procedure, to a thickness between about 500 to 1200 Angstroms, on underlying barrier layer 4, resulting in the first, or underlying, portion of the final copper seed layer. The deposition of copper seed layer 5a, is performed in a second chamber of the cluster tool, with the deposition terminated after about one half of the desired copper seed layer has been deposited. This limits the increase in surface temperature, resulting from a prolonged plasma bombardment, experienced during an extended PVD deposition, and therefore prevents formation of a copper seed layer, with an undesirable rough top surface topography.

Figure 3:
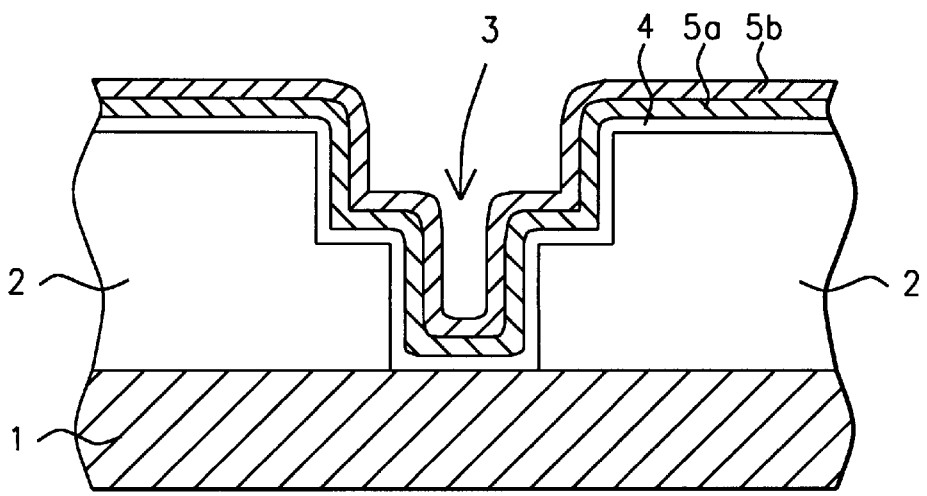

A second, and critical step, of the copper seed layer deposition sequence, a cool down cycle, is next performed in situ, in the second chamber of the cluster tool. An argon purge, applied to the front side, as well as to the backside, of the semiconductor substrate, allows the temperature reached during the first step of the copper seed deposition sequence to be reduced to room temperature. The third and final step of the copper seed layer deposition sequence, the deposition of overlying copper seed layer 5b, is next performed, in situ, in the second chamber of the cluster tool. Copper seed layer 5b, shown schematically in FIG. 3 is obtained via a PVD procedure, to a thickness between about 500 to 1200 Angstroms. Again, as was the case with copper seed layer 5a, only about one half the desired thickness, of a copper seed layer, was deposited in the third step of the copper seed deposition sequence, therefore not allowing the excessive plasma bombardment to occur, and this resulting in a smooth top surface topography for the composite copper seed layer, comprised of overlying copper seed layer 5b, and underlying copper seed layer 5a.

Figure 4:
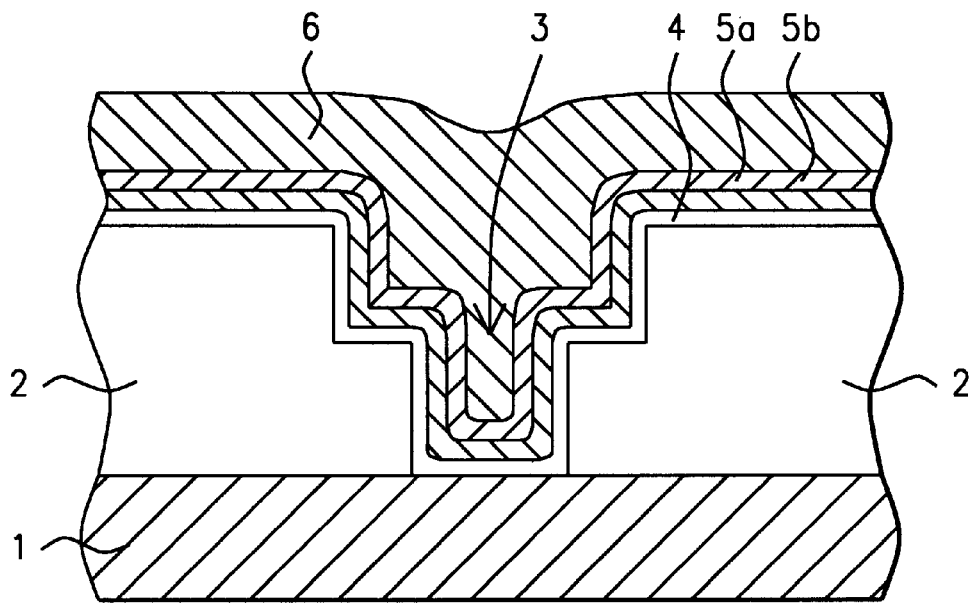
Figure 5:
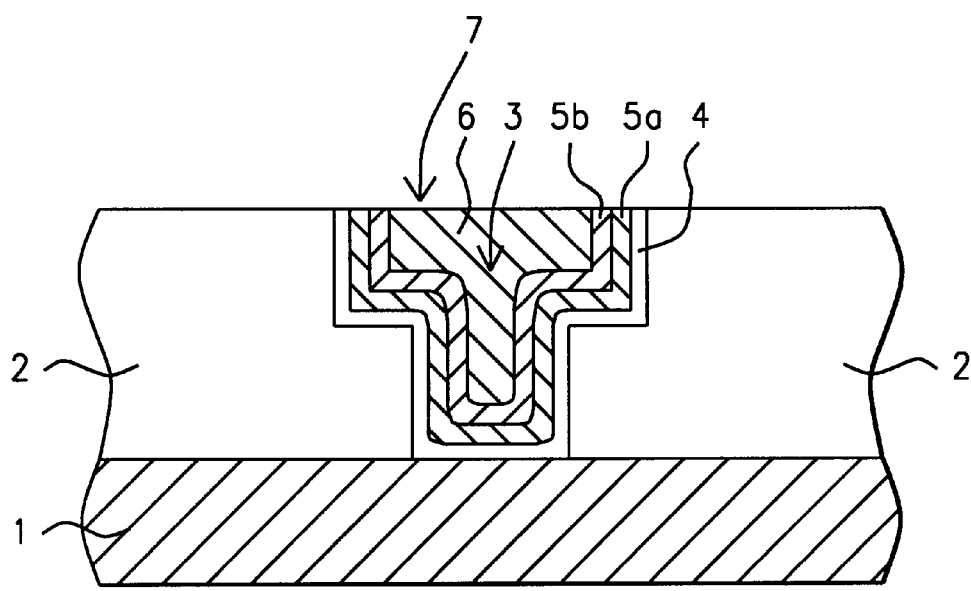

A thick copper layer 6, is next deposited using electrochemical deposition, (ECD), procedures, to a thickness between about 5000 to 16000 Angstroms, completely filling dual damascene opening 3. This is schematically shown in FIG. 4. Thick copper layer, or ECD copper layer 6, is formed on the underlying composite copper seed layer, using copper sulfate as a source. The smooth top surface topography of copper seed layer 5b, allowed the attainment of a voidless, ECD copper layer 6, featuring a smooth top surface topography. If copper seed layer 5b, had a rough top surface topography, the overlying ECD layer would have formed with a rough top surface topography, and included voids. Voidless ECD copper layer 6, featuring the smooth top surface topography, allows a CMP procedure, to successfully remove regions of ECD copper layer 6, regions of copper seed layer 5b, regions of copper seed layer 5a, and regions of the tantalum, or tantalum nitride barrier layer 4, from the top surface of insulator layer 2, resulting in the dual damascene copper structure 7, in dual damascene opening 3. This is schematically shown in FIG. 5. The smooth top surface of ECD copper layer 6, also allowed the CMP procedure to remove unwanted regions of material, without dishing, or spooning, or copper, which can occur if the ECD copper layer did not have a smooth top surface topography.

A second iteration of this invention is to perform the cooling step, of the copper seed layer deposition sequence, in a specific chamber of the cluster tool, dedicated to only the cooling step. Therefore after deposition of copper seed layer 5a, in the second chamber of the cluster tool, a third chamber is used to cool the semiconductor substrate. The cooling chamber can be comprised wherein the substrate is placed in contact with a fixture cooled by cooling water, or gas. The samples are then returned to the second chamber of cluster tool, for deposition of copper seed layer 5b. The resulting copper seed layer 5b, again presents a smooth top surface topography. The remainder of the process of achieving a damascene copper structure, is identical to the procedure described for the first iteration. That is deposition of an ECD copper layer, followed by a CMP procedure.

While this invention has been particularly shown and described with reference to the preferred embodiments thereof, it will be understood by those skilled in the art that various changes in form and details may be made without departing from the spirit and the scope of this invention.

What is claimed is:

1. A method of forming a metal structure, on a semiconductor substrate, comprising the steps of:
    providing an insulator layer, on said semiconductor substrate, and providing an opening in said insulator layer, exposing an underlying conductive region;
    depositing a barrier layer;
    depositing a first copper seed layer, in a chamber of a cluster tool;
    performing a cooling procedure to said semiconductor substrate, in situ, in said chamber of said cluster tool;
    depositing a second copper seed layer, on said first copper seed layer, in situ, in said chamber of said cluster tool, to a thickness between about 500 to 1200 Angstroms, using a plasma vapor deposition procedure;
    depositing a thick copper layer on said second copper layer, to a thickness between about 5000 to 16000 Angstroms, via a electro-chemical deposition procedure; and
    removing regions of said thick copper layer, regions of said second copper seed layer, regions of said first copper seed layer, and regions of said barrier layer, from the top surface of said insulator layer, to form said metal structure, in the opening in said insulator layer.

2. The method of claim 1, wherein said underlying conductive region, exposed at the bottom of said contact hole, is an underlying metal interconnect structure, formed from either an aluminum based metal layer, a refractory metal layer, such as tungsten, or a metal silicide layer, such as a tungsten silicide layer.

3. The method of claim 1, wherein said opening, in said insulator layer can be a dual damascene opening, comprised of an upper, wide diameter opening, and a lower, narrow diameter opening.

4. The method of claim 1, wherein said barrier layer is either a tantalum layer, of a tantalum nitride layer, deposited in a first chamber of a cluster tool, using a plasma vapor deposition, (PVD), procedure, such as R.F. sputtering, to a thickness between about 100 to 600 Angstroms.

5. The method of claim 1, wherein said first copper seed layer is deposited in a second chamber of a cluster tool, using a PVD procedure, such as R.F. sputtering, to a thickness between about 500 to 1200 Angstroms.

6. The method of claim 1, wherein said cooling procedure is performed in situ, in a second chamber of a cluster tool, via use of an argon purge, applied to the front side, as well as to the backside, of said semiconductor substrate.

7. The method of claim 1, wherein said metal structure is formed in the opening in said insulator layer, via removal of regions of said thick copper layer, regions of said second portion, copper seed layer, regions of said first copper seed layer, and regions of said barrier layer, from the top surface of said insulator layer, using a chemical mechanical polishing procedure.

8. A method of forming a dual damascene, copper structure, in a dual damascene opening in an insulator layer, comprised of an underlying copper seed layer, featuring a smooth top surface topography, resulting from a three step plasma vapor deposition sequence, and comprised of an overlying electro-chemical deposited copper layer, comprising the steps of:
    forming said dual damascene opening, in said insulator layer, exposing a portion of a top surface of a conductive region, on a semiconductor substrate;
    depositing a barrier layer, in a first chamber of a cluster tool: on the top surface of said insulator layer; coating the sides of the dual damascene opening; and overlying and contacting the portion of the top surface of said conductive region, exposed at the bottom of said dual damascene opening;
    depositing a first copper seed layer, on said barrier layer, in a second chamber of the cluster tool;
    performing an argon purge procedure, in situ in said second chamber of the cluster tool, to cool said semiconductor substrate;
    depositing a second copper seed layer, in situ, in said second chamber of the cluster tool, to a thickness between about 500 to 1200 Angstroms, using a plasma vapor deposition procedure, with said second copper seed layer having a smooth top surface topography;
    depositing a thick copper layer, via an electro-chemical deposition, (ECD), procedure, on said second copper seed layer, completely filling said dual damascene opening; and
    performing a chemical mechanical polishing procedure, to remove regions of said thick copper layer, regions of said second copper seed layer, regions of said first copper seed layer, and regions of said barrier layer, from the top surface of said insulator layer, creating said dual damascene copper structure, in said dual damascene opening.

9. The method of claim 8, wherein said conductive region, at the bottom of said dual damascene opening, is an underlying metal interconnect structure, formed from either an aluminum based layer, a tungsten layer, of a tungsten silicide layer.

10. The method of claim 8, wherein said barrier layer is a tantalum layer, obtained via a plasma vapor deposition, (PVD), procedure, such as R.F. sputtering, to a thickness between about 100 to 600 Angstroms.

11. The method of claim 8, wherein said barrier layer is a tantalum nitride layer, obtained via PVD procedure, such as R.F. sputtering, to a thickness between about 100 to 600 Angstroms.

12. The method of claim 8, wherein said first copper seed layer is deposited using a PVD procedure, such as R.F. sputtering, to a thickness between about 500 to 1200 Angstroms.

13. The method of claim 8, wherein said argon purge procedure, is performed to both front side, and backside, of said semiconductor substrate.

14. The method of claim 8, wherein said thick copper laser is deposited using ECD procedures, to a thickness between about 5000 to 16000 Angstroms.

* * * * *